United States Patent
Akamatsu

[11] Patent Number: 6,121,650
[45] Date of Patent: Sep. 19, 2000

[54] SEMICONDUCTOR MEMORY DEVICE WITH INCREASED CHARGE RETENTION CAPACITY AND METHOD FOR FORMING THE SAME

[75] Inventor: Susumu Akamatsu, Katano, Japan

[73] Assignee: Matsushita Electronics Corporation, Osaka, Japan

[21] Appl. No.: 08/960,144

[22] Filed: Oct. 29, 1997

[30] Foreign Application Priority Data

Oct. 31, 1996 [JP] Japan ................................ 8-290362

[51] Int. Cl.$^7$ ........................ H01L 27/108; H01L 29/76
[52] U.S. Cl. ........................ 257/296; 257/306; 257/399; 257/68
[58] Field of Search .................. 257/68, 69, 71, 257/296, 297, 298, 300, 306, 308, 311, 313, 547, 399, 408; 438/238, 239

[56] References Cited

U.S. PATENT DOCUMENTS

| 5,440,165 | 8/1995 | Mitsunaga et al. ............. 257/399 |
| 5,932,906 | 8/1999 | Shimizu ........................... 257/306 |

FOREIGN PATENT DOCUMENTS

| 62-2562 | 1/1987 | Japan . |
| 2-177359 | 7/1990 | Japan . |

Primary Examiner—Tom Thomas
Assistant Examiner—Hung K. Vu
Attorney, Agent, or Firm—Ratner & Prestia

[57] ABSTRACT

A semiconductor device includes a gate electrode (4) formed of a conductive material on a semiconductor substrate (1) of one conductivity type with a gate insulating film (3) therebetween; first and second diffusion regions (5, 10) of another conductivity type formed on the semiconductor substrate (1) so as to sandwich the gate electrode (4); and a contact hole (17) for electrically connecting one (first) (10) of the first and second diffusion regions (5, 10) to a lower electrode (8) of a cell capacitor for storing charge therein, and has a characteristic that when a reverse voltage Vrev is applied as a junction application voltage between semiconductors of different conductivity types of the first diffusion region (10) and the semiconductor substrate (1) (positive potential is applied to the n-type semiconductor side and zero or negative potential, to the p-type semiconductor side), a leakage current Ileak flows between the first diffusion region (10) and the semiconductor substrate (1), and the junction application voltage Vrev when the leakage current Ileak is $$Ileak = Cs \times (Vbit/2) \times (1/T) \times (1/S)$$

(where a charge storage capacitance in the cell capacitor is Cs, a voltage applied to a data line (12) connected to the other (second) (5) of the first and second diffusion regions (5, 10) is Vbit, a target charge retention time is T and an area of the first diffusion region (10) is S) is three times or higher than the voltage Vbit applied to the data line (12) at room temperature.

2 Claims, 6 Drawing Sheets (a)

(b)

(c)

(d)

(e)

(f)

(g)

6,121,650

SEMICONDUCTOR MEMORY DEVICE WITH INCREASED CHARGE RETENTION CAPACITY AND METHOD FOR FORMING THE SAME

BACKGROUND OF THE INVENTION

1. Field of the Invention

The present invention relates to a semiconductor device such as a dynamic memory and a method of manufacturing the same.

2. Related Art of the Invention

It has conventionally been known that a leakage current generated in a memory cell of a dynamic memory adversely affects the charge retention characteristic of the memory cell. To prevent this, for example, in a semiconductor device disclosed in Japanese Laid-open Patent Application No. S62-2562, both of the source and drain diffusion regions are formed low in concentration in a transistor which is a portion of a memory cell where the leakage current is necessarily prevented. FIG. 4(a) shows the structure thereof. In the figure, reference numeral 41 represents a silicon substrate (first conductivity type), reference numeral 42 represents an isolation oxide film (LOCOS), reference numeral 43 represents a gate oxide film, reference numeral 44 represents a gate electrode, reference numeral 45 represents low-concentration source and drain diffusion regions (second conductivity type), reference numeral 46 represents an oxide film, reference numeral 47 represents high-concentration source and drain diffusion regions (second conductivity type), and reference numeral 48 represents a lower electrode of a cell capacitor. The low-concentration source and drain diffusion regions 45 correspond to the both of the surface and drain diffusion regions of a transistor which is a portion where the leakage current is necessarily prevented.

Examples of means for increasing the capacity of the cell include one as disclosed in Japanese Laid-open Patent Application No. H2-177359. FIG. 4(b) shows the structure thereof. Portions the same as those shown in FIG. 4(a) will be described by use of the same reference numerals. Reference numeral 41 represents a silicon substrate (first conductivity type). Reference numeral 42 represents an isolation oxide film (LOCOS). Reference numeral 43 represents a gate oxide film. Reference numeral 44 represents a gate electrode. Reference numeral 45 represents low-concentration source and drain diffusion regions (second conductivity type). Reference numeral 46 represents an oxide film. Reference numeral 48 represents a lower electrode of a cell capacitor. Reference numeral 49 represents a high-concentration diffusion region (first conductivity type). In one of the diffusion regions (the one connected to the cell capacitor) in the source and the drain, the high-concentration diffusion region 49 having the same conductivity type as the substrate is formed and the capacity of the cell is increased by use of the junction capacitance.

However, since devices has recently become denser as the degree of integration increases, it is necessary to decrease the depth of the diffusion regions in order to prevent a short channel effect of a switching transistor. Therefore, only reducing the concentration of both of the source and drain diffusion regions like in the prior arts degrades the junction characteristic because the surface of the semiconductor substrate is etched in forming the contact hole for connecting the diffusion layers and the cell capacitor, so that the leakage current increases.

Moreover, forming the high-concentration diffusion regions of the different conductivity type so as to adjoin the drain and source diffusion regions in order to increase the capacity of the cell also increases the leakage drain.

Thus, the conventional methods all present a problem that the charge retention characteristic is degraded.

SUMMARY OF THE INVENTION

The present invention solves the above-mentioned conventional problems and an object thereof is to provide a semiconductor device and a method of manufacturing the same wherein a necessary charge retention characteristic is satisfied, there is little variation with time and long-term reliability is high.

The present invention is a semiconductor device comprising:

a gate electrode (4) formed of a conductive material on a semiconductor substrate (1) of one conductivity type with a gate insulating film (3) therebetween;

first and second diffusion regions (5, 10) of another conductivity type formed on said semiconductor substrate (1) so as to sandwich said gate electrode (4); and a contact hole (17) for electrically connecting one (first) (10) of said first and second diffusion regions (5, 10) to a lower electrode (8) of a cell capacitor for storing charge therein, wherein said semiconductor device has a characteristic that when a reverse voltage Vrev is applied as a junction application voltage between semiconductors of different conductivity types of said first diffusion region (10) and said semiconductor substrate (1) (positive potential is applied to the n-type semiconductor side and zero or negative potential, to the p-type semiconductor side), a leakage current Ileak flows between said first diffusion region (10) and said semiconductor substrate (1), and said junction application voltage Vrev when the leakage current Ileak is $$Ileak = Cs \times (Vbit/2) \times (1/T) \times (1/S)$$

(where a charge storage capacitance in said cell capacitor is Cs, a voltage applied to a data line (12) connected to the other (second) (5) of said first and second diffusion regions (5, 10) is Vbit, a target charge retention time is T and an area of the first diffusion region (10) is S) is three times or higher than the voltage Vbit applied to said data line (12) at room temperature.

DESCRIPTION OF THE REFERENCE NUMERALS

Figure 1:
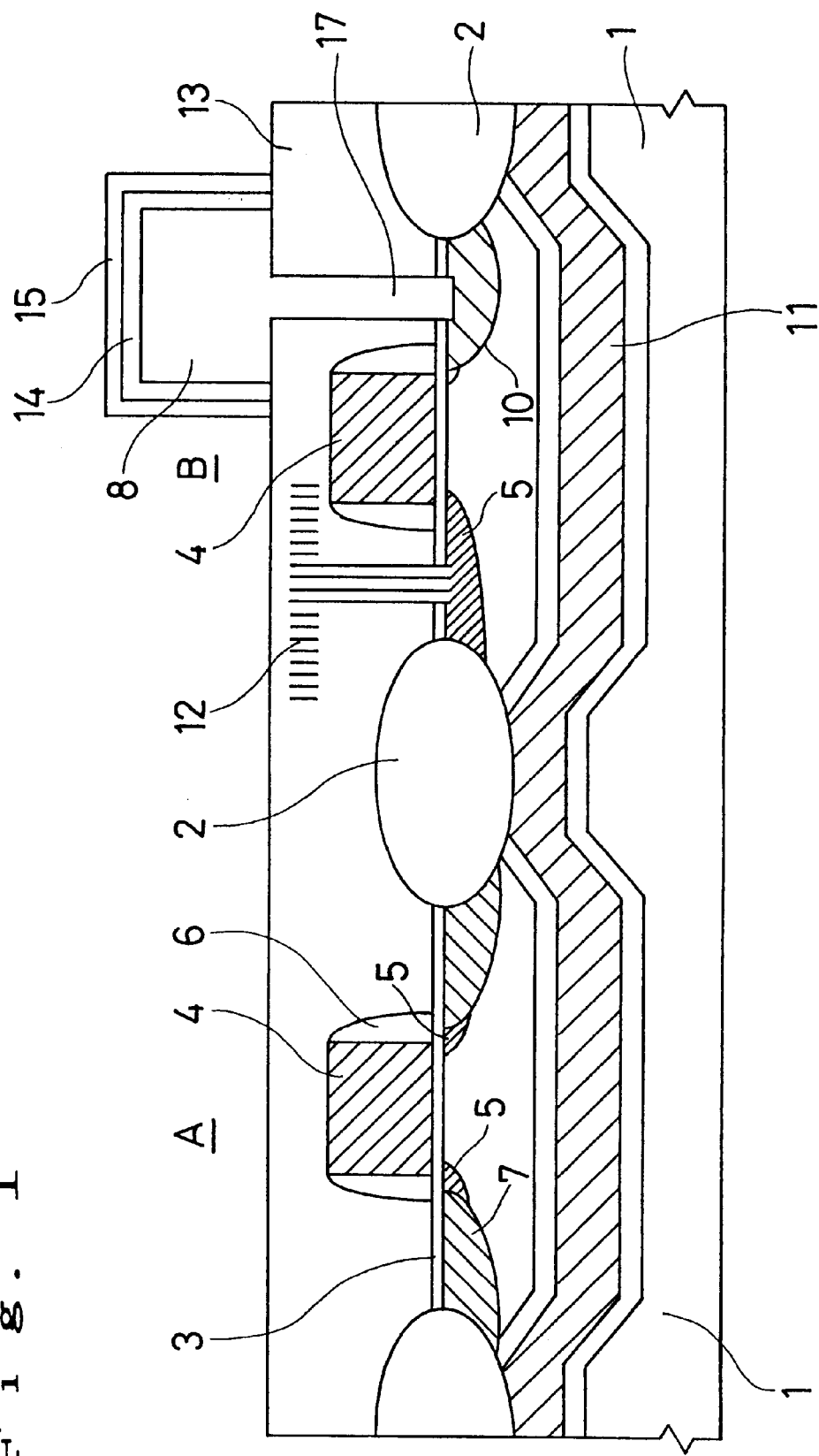
FIG. 1 is a cross-sectional view showing the structure of a field effect transistor of a memory cell portion and a circuit portion of a dynamic memory in a first embodiment of a semiconductor device of the present invention.

1 . . . semiconductor substrate, 2 . . . insulating film region, 3 . . . gate oxide film, 4 . . . gate electrode, 5 . . . low-concentration n-type first diffusion layer, 6 . . . side wall, 7 . . . high-concentration n-type diffusion layer, 8 . . . lower electrode, 10 . . . n-type second diffusion layer, 11 . . . p-type channel stop region, 12 . . . data line, 13 . . . layer-layer insulating film, 14 . . . capacity insulating film, 15 . . . upper electrode, 16 . . . ion beam, 17 . . . contact hole

DESCRIPTION OF THE PREFERRED EMBODIMENTS

Embodiments of the present invention will hereinafter be described with reference to the drawings. Portions corresponding to those of the above-described prior arts are denoted by the same reference numerals.

(First Embodiment)

FIG. 1 is a cross-sectional view showing the structure of a field effect transistor of a memory cell portion B and a circuit portion A of a dynamic memory in a first embodiment of a semiconductor device of the present invention. On a p-type semiconductor substrate 1, an insulating film region 2 is provided for isolation between adjoining components and on the surface of the substrate 1, a gate oxide film 3 is provided comprising a silicon oxide film. Inside of the substrate 1, a p-type channel stop region 11 is provided. On the gate oxide film 3, a gate electrode 4 is provided comprising a polysilicon film and on the side wall of the gate electrode 4, a side wall 6 is provided comprising an oxide film.

In the transistor of the circuit portion A, a low-concentration n-type diffusion layer 5 (formed, for example, by implanting phosphorus) and a high-concentration n-type diffusion layer 7 (formed, for example, by implanting arsenic) are provided on both sides of the gate electrode 4.

In the memory cell portion B, a low-concentration n-type diffusion layer 5 (formed, for example, by implanting phosphorus) similar to the one described above is provided and connected to a data line 12. On the other hand, an n-type diffusion layer region 10 is connected to a lower electrode 8 of a cell capacitor comprising an n-type polysilicon film (formed, for example, by doping phosphorus). The diffusion layer region 10 is an n-type diffusion layer region of a concentration similar to or higher than that of the low-concentration n-type diffusion layer 5 and the depth of diffusion thereof is similar to or greater than that of the low-concentration n-type diffusion layer 5. The depth of diffusion of the diffusion layer region 10 is approximately half or more of the distance from the gate oxide film 3 to the interface between the semiconductor substrate 1 and an isolation oxide film (2), i.e. the interface between the isolation oxide film 2 and the p-type channel stop region 11 in the embodiment of FIG. 1.

As a junction application voltage for joining the semiconductors of different conductivity types of the n-type diffusion layer region 10 and the semiconductor substrate 1, a reverse voltage is applied (positive potential is applied to the n-type semiconductor side and zero or negative potential, to the p-type semiconductor side) to thereby join the semiconductors.

On the upper surface of the lower electrode 8, a capacity insulating film 14 is provided and an upper electrode 15 is provided thereon so as to sandwich it. Reference numeral 13 represents a layer-layer insulating film.

Figure 2A:
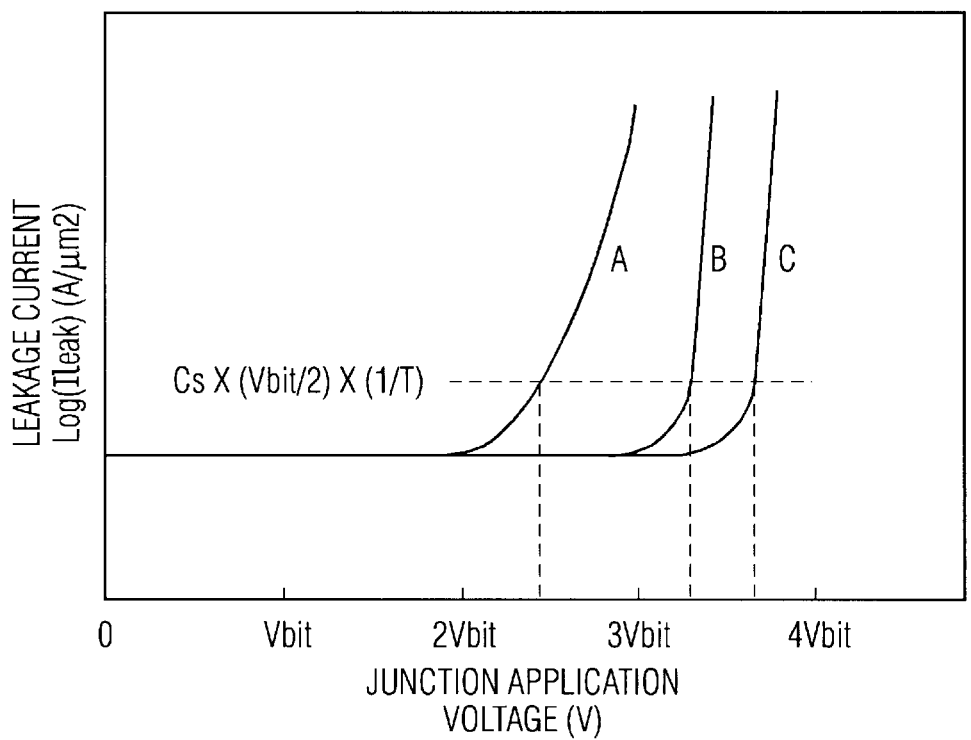
FIG. 2(a) is a graph showing junction characteristics of a diffusion region and a semiconductor substrate of a memory cell portion of the dynamic memory in the first embodiment of the semiconductor device of the present invention.
Figure 2B:
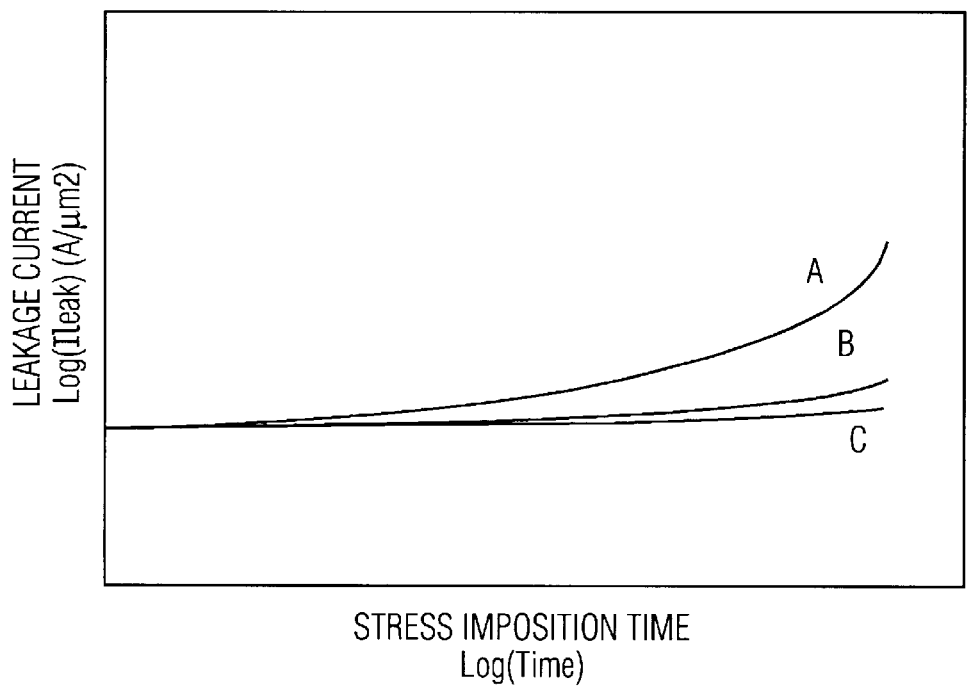
FIG. 2(b) is a graph showing variation with time in leak characteristics when a stress is imposed on the junction.

FIG. 2(a) is a graph showing junction characteristics of the junction voltage between the n-type diffusion layer region 10 connected to the lower electrode 8 and the semiconductor substrate 1 in the first embodiment. This figure shows a relationship between a leakage current Ileak and a junction application voltage (V) when the charge storage capacitance in the cell capacitor is Cs, a voltage applied to the data line 12 is Vbit, a desired charge retention time is T and the area of the diffusion region 10 is S. In FIG. 2(a), curved lines A, B and C represent characteristics under the same heat treatment conditions when the concentrations of phosphorus of the lower electrode 8 of the cell capacitor are $1.5 \times 10^{20}/cm^3$, $3.3 \times 10^{20}/cm^3$ and $5.0 \times 10^{20}/cm^3$, respectively. FIG. 2(b) is a graph showing variation with time in leak characteristics when a stress is imposed on the junction.

In FIG. 2(a), in the curved lines B and C, the junction application voltage (V) exceeds three times the voltage Vbit when the leakage current Ileak takes the value of an expression 1. It can be said that a semiconductor device having characteristics as shown by the curved lines B and C has excellent characteristics because the leakage current Ileak does not vary with time so much as shown in FIG. 2(b). On the contrary, in the curved line A, when the leakage current Ileak takes the value of the expression 1, the junction application voltage (V) is lower than three times the voltage Vbit. It is therefore apparent that a semiconductor device having a characteristic as shown in the curved line A is inferior in performance since the variation with time is great as shown in FIG. 2(b).

[Expression 1]

$$Ileak = Cs \times (Vbit/2) \times (1/T) \times (1/S)$$

Here, the charge storage capacitance in the cell capacitor is Cs[F], the voltage applied to the data line (12) connected to the other (5) of the diffusion regions (5, 10) is Vbit[V], a target charge retention time is T[sec], and the area of the diffusion layer (10) is S[$cm^2$].

Therefore, the impurity distributions of the n-type diffusion layer region 10, the semiconductor substrate 1 and the p-type channel stop region 11 are set so that the semiconductor device has a characteristic that the junction application voltage exceeds three times the voltage Vbit when such a predetermined leakage current Ileak flows. While the concentration of phosphorus of the lower electrode 8 under the same heat treatment conditions has been described, the same results will be obtained when the heat treatment temperature and time are varied without the phosphorus concentration of the lower electrode 8 being varied.

Figure 2C:
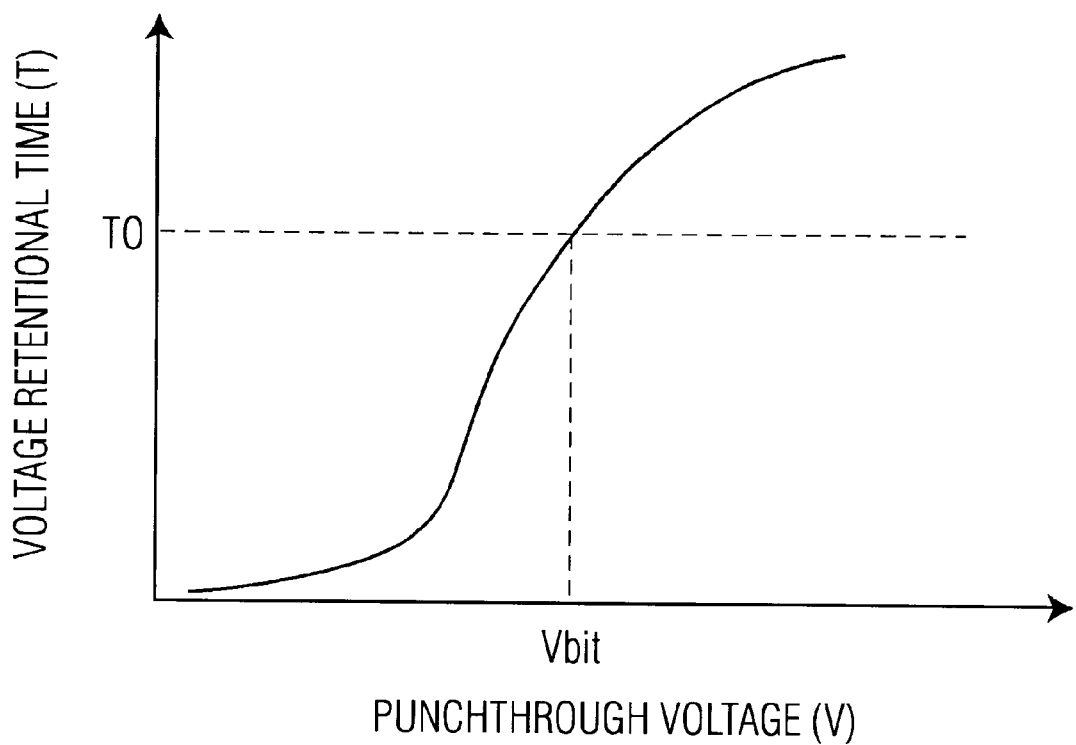
FIG. 2(c) is a graph showing a relationship between a voltage applied between a diffusion region of the memory cell portion and the diffusion region of a circuit portion, and a charge retention time.

FIG. 2(c) is a graph in which for semiconductor devices of various characteristics, the lateral axis represents values of an application voltage Vrevp when a punchthrough current flowing between the diffusion layer 10 connected to a contact hole 17 of the memory cell portion B and another diffusion region 10 (not shown) connected to the contact hole 17 of another memory cell portion (not shown) adjoining the memory cell portion B with the isolation region 2 therebetween is Ileak when a voltage is applied between the regions 10 (positive potential is applied to one of the regions 10 and zero potential, to the other thereof), and the longitudinal axis represents the voltage retention time T of the cell capacitor at each value of the punchthrough voltage Vrevp. A necessary charge retention time T is represented by T0. Since the voltage realizing T0 is Vbit, the necessary charge retention time is ensured by forming the semiconductor device so that the voltage when the punchthrough current flowing between the regions is Ileak exceeds Vbit.

Thus, the impurity distribution of the n-type diffusion layer region 10 connected to the contact hole 17, the n-type diffusion region 10 connected to the contact hole 17 of another cell capacitor and adjoining with the isolation region 2 therebetween, the lower portion of the diffusion layer regions and the lower portion of the isolation region inside the semiconductor substrate, and the configuration and the depth of the isolation region oxide film are controlled so that when a voltage is applied between the regions 10 (positive potential is applied to one of the regions 10 and zero potential, to the other thereof), the voltage when the current (punchthrough current) flowing between the regions 10 is Ileak is equal to or higher than the voltage Vbit applied to the data line.

As described above, according to this embodiment, a dynamic memory is obtained in which a necessary charge retention characteristic is satisfied, there is little variation with time and long-term reliability is high.

(Second Embodiment)

Figure 3:
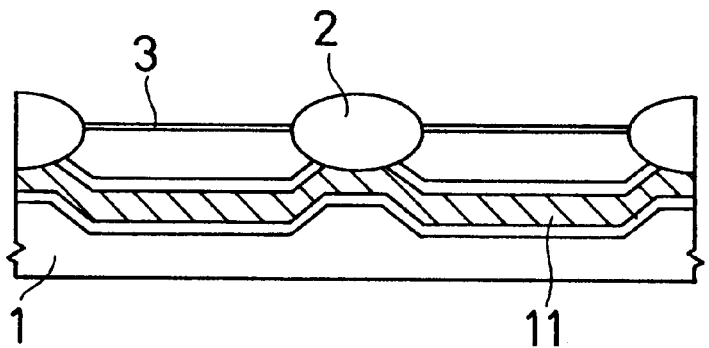
FIG. 3 is a cross-sectional view of a field effect transistor of a memory cell portion and a circuit portion for explaining dynamic memory manufacturing steps in a second embodiment of a method of manufacturing a semiconductor device of the present invention.
Figure 3:
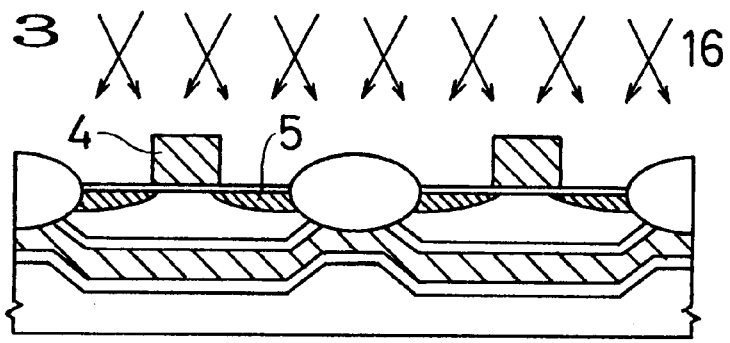
Figure 3:
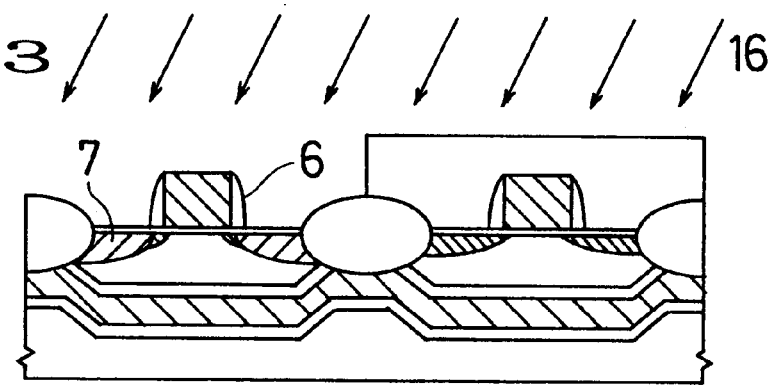
Figure 3:
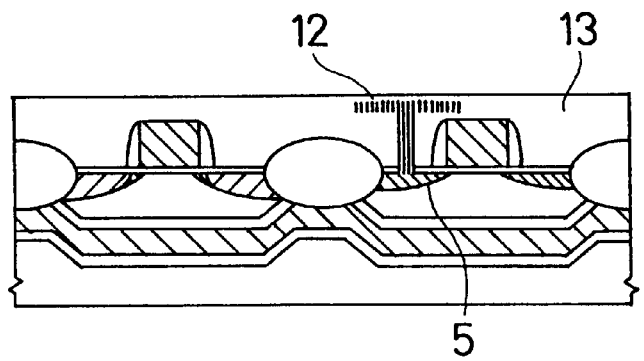
Figure 3:
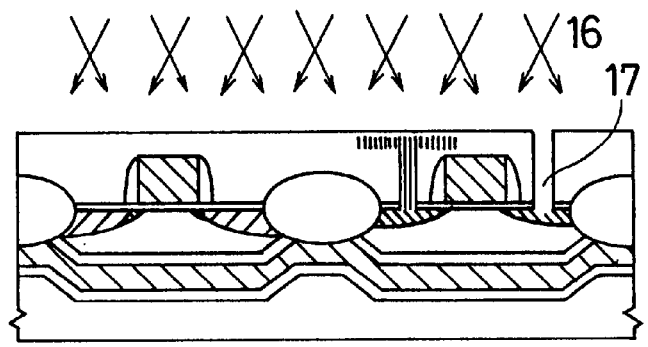
Figure 3:
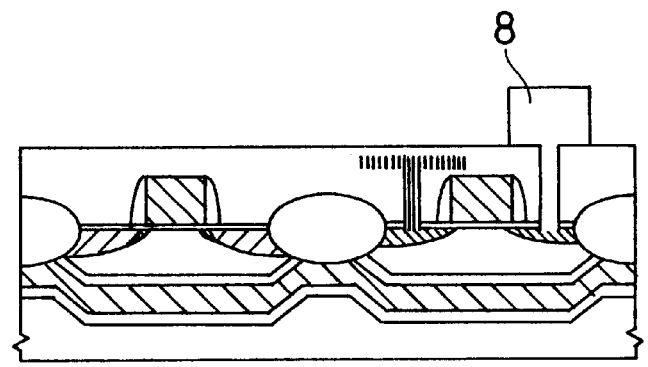
Figure 3:
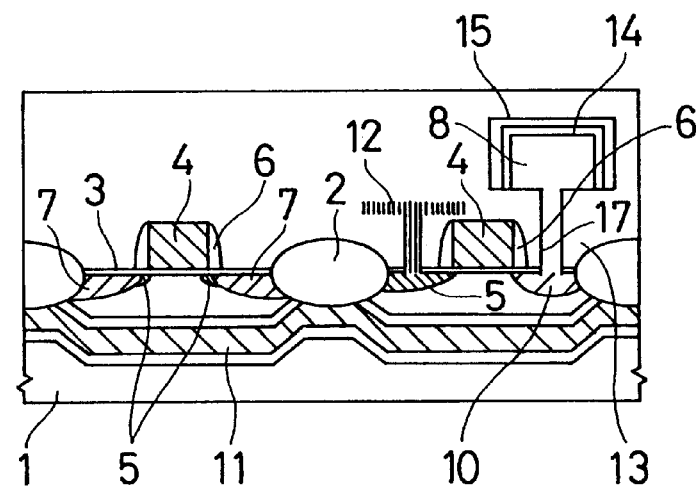
Figure 4A:
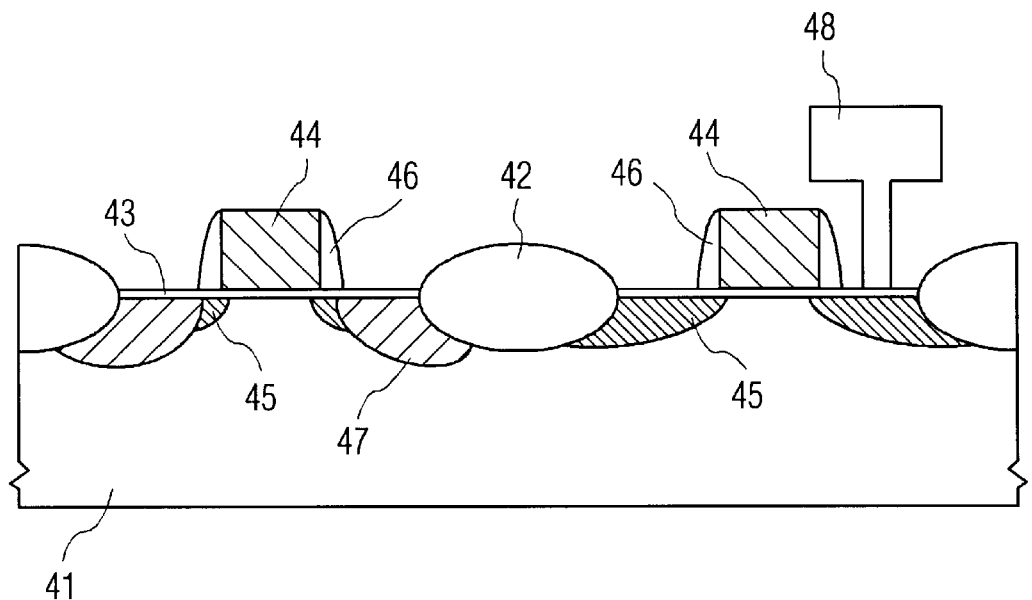
FIG. 4 is a cross-sectional view showing the structure of a field effect transistor of a memory cell portion and a circuit portion of a conventional dynamic memory.
Figure 4B:
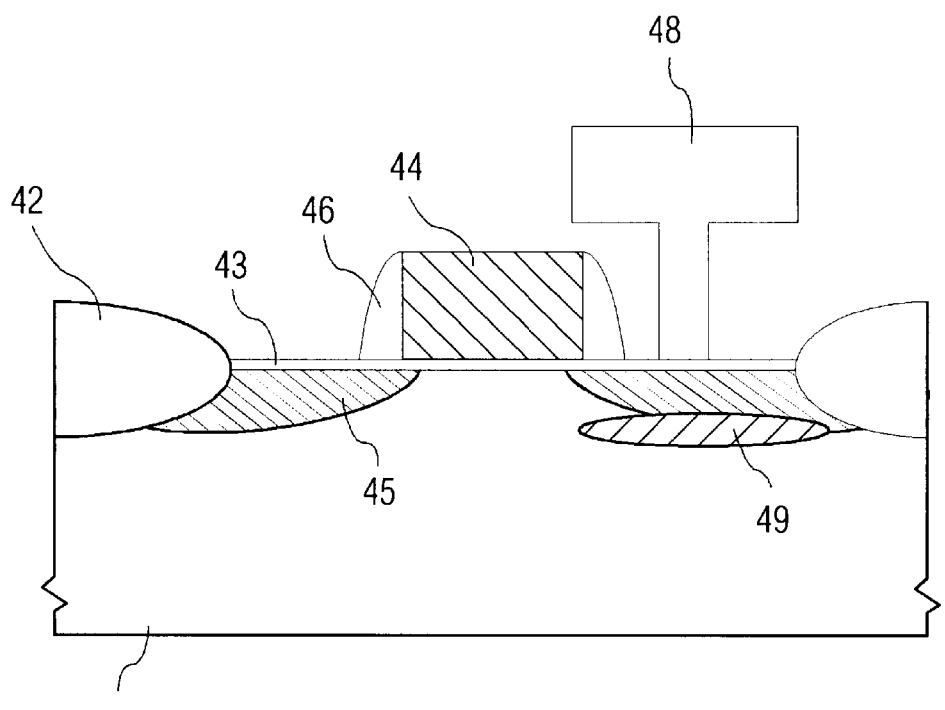

FIG. 3 is a cross-sectional view of a field effect transistor of a memory cell portion and a circuit portion for explaining dynamic memory manufacturing steps in a second embodiment of a method of manufacturing a semiconductor device of the present invention. In FIGS. 3(a) to 3(c), the cross-sectional structure of the field effect transistor of the circuit portion is shown on the left side and the cross-sectional structure of the field effect transistor of the memory cell portion and the cell capacitor are shown on the right side.

The manufacturing steps will be described. First, as shown in FIG. 3(a), in the surface portion of the semiconductor substrate 1, the isolation insulating film 2 and the p-type channel stop region 11 are formed (for example, approximately $1 \times 10^{12}$ to $1 \times 10^{13}/cm^2$ of boron is ion-implanted as the impurity). Then, the gate oxide film 3 is formed.

Then, as shown in FIG. 3(b), polysilicon is deposited and the region to be removed is etched with a mask to thereby form the gate electrode 4. Then, the substrate 1 is rotated (for example, four times every 90 degrees) and an n-type impurity (for example, approximately $1 \times 10^{13}/cm^2$ of phosphorus) is ion-implanted by use of an ion beam 16 to thereby form the low-concentration n-type diffusion layer 5.

Then, as shown in FIG. 3(c), an oxide film is deposited and etched back to thereby form the side wall 6 on the side wall of the gate electrode 4. Then, with a mask being placed over the cell portion B. an n-type impurity is again implanted to thereby form the high-concentration n-type diffusion layer 7. In this implantation, for example, approximately $1 \times 10^{15}$ to $10^{16}/cm^2$ of arsenic is used as the n-type impurity.

Then, as shown in FIG. 3(d), the layer-layer insulating film 13 is deposited, a hole for contact is formed above the diffusion layer 5, not to be connected to the cell capacitor, of the transistor of the memory cell B, and the data line 12 is formed. Then, the layer-layer insulating film 13 is further deposited and the surface is flattened.

Then, as shown in FIG. 3(e), the contact hole 17 is formed above the other diffusion region of the transistor of the memory cell portion B. With the layer-layer film being as the mask and the substrate 1 being rotated (for example four times every 90 degrees), an n-type impurity, for example, approximately $5 \times 10^{12}$ to $5 \times 10^{13}/cm^2$ of phosphorus is ion-implanted only into the diffusion layer to be connected to the cell capacitor through the contact hole 17. With this implantation, the Si layer damaged in forming the contact hole 17 is covered with $1 \times 10^{18}/cm^3$.

Then, as shown in FIG. 3(f), polysilicon is deposited and the region to be removed is etched to thereby form the lower electrode 8 of the capacitor. Then, as shown in FIG. 3(g), the capacity insulating film 14 and the upper electrode 15 are formed, the layer-layer film is deposited and a heat treatment is performed at a treatment temperature of 700° C. or higher. The dynamic memory is thus obtained.

As described above, according to this embodiment, a dynamic memory is easily manufactured in which a necessary charge retention characteristic is satisfied, there is little variation with time and long-term reliability is high.

As described above, according to the present invention, by controlling the impurity distribution in the semiconductor substrate, a semiconductor device and a method of manufacturing the same are obtained wherein a necessary charge retention characteristic is satisfied, there is little variation with time and long-term reliability is high.

What is claimed is:

1. A semiconductor device comprising:

a gate electrode formed of a conductive material on a semiconductor substrate of one conductivity type with a gate insulating film therebetween;

first and second diffusion regions of another conductivity type formed on said semiconductor substrate so as to sandwich said gate electrode; and a contact hole for electrically connecting one of said first and second diffusion regions to a lower electrode of a cell capacitor for storing charge therein, wherein said semiconductor device has a characteristic that when a reverse voltage Vrev is applied as a junction application voltage between semiconductors of different conductivity types of said first diffusion region and said semiconductor substrate, a leakage current Ileak flows between said first diffusion region and said semiconductor substrate, and said junction application voltage Vrev when the leakage current Ileak is $$Ileak = Cs \times (Vbit/2) \times (1/T) \times (1/S),$$

is three times or higher than a voltage Vbit applied to a data line connected to the other of said first and second diffusion regions at room temperature.

2. A semiconductor device according to claim 1, wherein in dry etching in forming said contact hole, a damaged layer generated in said first diffusion region connected to said lower electrode of said capacitor is covered with a region having an impurity concentration of $1E18/cm^3$ or higher.

* * * * *